(12) United States Patent
Sharoni et al.

(10) Patent No.: US 9,134,112 B2
(45) Date of Patent: Sep. 15, 2015

(54) CRITICAL DIMENSION UNIFORMITY CORRECTION BY SCANNER SIGNATURE CONTROL

(75) Inventors: Ofir Sharoni, Karkur (IL); Vladimir Dmitriev, Karmiel (IL); Eran Chason, Spring Grove (SG); Guy Ben-Zvi, Shechania (IL); Igor Varvaruk, Migdal Haemek (IL)

(73) Assignee: Carl Zeiss SMS Ltd., Karmiel (IL)

( * ) Notice: Subject to any disclaimer, the term of this patent is extended or adjusted under 35 U.S.C. 154(b) by 328 days.

(21) Appl. No.: 13/579,366

(22) PCT Filed: Feb. 23, 2011

(86) PCT No.: PCT/IB2011/000366
§ 371 (c)(1),
(2), (4) Date: Dec. 5, 2012

(87) PCT Pub. No.: WO2011/104613
PCT Pub. Date: Sep. 1, 2011

(65) Prior Publication Data
US 2013/0077101 A1    Mar. 28, 2013

Related U.S. Application Data

(60) Provisional application No. 61/307,220, filed on Feb. 23, 2010.

(51) Int. Cl.
*G03F 1/76* (2012.01)
*G01B 11/00* (2006.01)
*G03F 1/00* (2012.01)
(Continued)

(52) U.S. Cl.
CPC ............... *G01B 11/00* (2013.01); *G03F 1/144* (2013.01); *G03F 1/48* (2013.01); *G03F 7/70625* (2013.01)

(58) Field of Classification Search
USPC ..................... 356/237.1–241.6, 242.1–243.8, 356/426–431, 600–640
See application file for complete search history.

(56) References Cited

U.S. PATENT DOCUMENTS 6,781,688 B2 * 8/2004 Kren et al. ................. 356/237.4
7,001,697 B2 * 2/2006 Park et al. ........................ 430/5
(Continued)

FOREIGN PATENT DOCUMENTS

WO    WO 2005/008333      1/2005
WO    WO2005/008333    *   1/2005
(Continued)

OTHER PUBLICATIONS

International Search Report and Written Opinion dated Jul. 6, 2011 from corresponding application PCT/IB2011/000366.

*Primary Examiner* — Kara E Geisel
*Assistant Examiner* — Jarreas C Underwood
(74) *Attorney, Agent, or Firm* — Fish & Richardson P.C.

(57) ABSTRACT

A contribution to a wafer level critical dimension distribution from a scanner of a lithography system can be determined based on measured wafer level critical dimension uniformity distribution and a contribution to the wafer level critical dimension distribution from a photo mask. Light transmission (104) across the photo mask (162) can be measured, a transmittance variation distribution of the photo mask can be determined, and the contribution to the wafer level critical dimension distribution from the photo mask (162) can be determined (132) based on the transmittance variation distribution of the photo mask.

25 Claims, 15 Drawing Sheets

(51) Int. Cl.
*G03F 1/48* (2012.01)
*G03F 7/20* (2006.01)

(56) References Cited

U.S. PATENT DOCUMENTS

| | | | | |
|---|---|---|---|---|
| 7,234,128 | B2 * | 6/2007 | Gau et al. | 382/144 |
| 7,250,309 | B2 * | 7/2007 | Mak et al. | 438/14 |
| 7,325,222 | B2 * | 1/2008 | Strelkova et al. | 716/52 |
| 7,521,156 | B2 * | 4/2009 | Ahn et al. | 430/5 |
| 8,057,967 | B2 * | 11/2011 | Ye et al. | 430/5 |
| 8,289,515 | B2 * | 10/2012 | Cohen et al. | 356/369 |
| 8,421,026 | B2 * | 4/2013 | Ben-Zvi et al. | 250/372 |
| 8,730,474 | B2 * | 5/2014 | Scheruebl et al. | 356/401 |
| 2007/0009816 | A1 * | 1/2007 | Pforr et al. | 430/30 |
| 2007/0190438 | A1 * | 8/2007 | Kim et al. | 430/30 |
| 2012/0064713 | A1 * | 3/2012 | Russell et al. | 438/653 |

FOREIGN PATENT DOCUMENTS

| | | |
|---|---|---|
| WO | WO 2006/133729 | 12/2006 |
| WO | WO2006/133729 | * 12/2006 |
| WO | WO 2009/083606 | 7/2009 |
| WO | WO2009/083606 | * 7/2009 |

* cited by examiner

CRITICAL DIMENSION UNIFORMITY CORRECTION BY SCANNER SIGNATURE CONTROL

CROSS-REFERENCE TO RELATED APPLICATIONS

This application is a national stage application of PCT/IB2011/000366, filed on Feb. 23, 2011, which claims priority to U.S. Provisional Application No. 61/307,220, filed on Feb. 23, 2010, hereby incorporated by reference in its entirety.

TECHNICAL FIELD

This subject matter is generally related to critical dimension uniformity correction by scanner signature control.

BACKGROUND

Integrated circuits can be fabricated on a semiconductor wafer using a photolithography process. As feature sizes of the integrated circuits become smaller, it is important to control the uniformity of the critical dimensions on the wafer. The critical dimensions refer to the dimensions of critical features on the wafer, such as minimum line width of single lines, minimum line width of densely spaced lines, and the minimum size of contact holes. The critical dimension uniformity greatly affects the yield and performance of semiconductor chips produced from each wafer. The critical dimensions on the wafer can be measured using, for example, scanning electron microscopy. When non-uniformity in the critical dimensions on the wafer is detected, the photolithography system can be adjusted to reduce the non-uniformity to improve the quality of the integrated circuits fabricated on the wafer.

SUMMARY

In general, in one aspect, a method includes determining a contribution to a wafer level critical dimension distribution from a scanner of a lithography system based on measured wafer level critical dimension uniformity distribution and a contribution to the wafer level critical dimension distribution from a photo mask.

Implementations of the method may include one or more of the following features. The method can include determining the contribution to the wafer level critical dimension distribution from the photo mask by measuring light transmission across the photo mask. Determining the contribution to the wafer level critical dimension distribution from the photo mask can include determining a transmittance variation distribution of the photo mask, and determining the contribution to the wafer level critical dimension distribution from the photo mask based on the transmittance variation distribution of the photo mask. Determining the contribution to the wafer level critical dimension distribution from the photo mask based on the transmittance variation distribution of the photo mask can include applying a correction factor to the transmittance variation distribution of the photo mask, the correction factor being based on a linear ratio between wafer level critical dimension variations and transmission variations. Determining the transmittance variation distribution of the photo mask can include measuring the transmittance at one location in each of a plurality of regions of the photo mask, each region having a pattern corresponding to a die, calculating an average of the measurement values for corresponding locations of the plurality of regions, for each measurement value, calculating a ratio between the measurement value and the average, and determining the transmittance variation distribution of the photo mask based on the ratios. The method can include measuring the transmittance at a plurality of locations in each of the plurality of regions, each location in any region having a corresponding location in each of the other regions, for each group of corresponding locations in the plurality of regions, calculating an average of the transmittance for the group of corresponding locations, for each location in the group, calculating a ratio between the transmittance of the location and the average transmittance for the group, and determining the transmittance variation distribution of the photo mask based on the ratios. Measuring the light transmission can include performing transmission measurements at a plurality of locations on the photo mask using a non-imaging tool to generate transmission information. The wafer level critical dimension distribution can include a matrix of wafer level critical dimension values.

The method can include determining a contribution to a second wafer level critical dimension distribution from a second photo mask. The first wafer level critical dimension distribution and the second wafer level critical dimension distribution can be associated with different layers of a same wafer, or with different wafers. Determining a contribution to a second wafer level critical dimension distribution can include determining a contribution to a second wafer level critical dimension distribution from a second photo mask by measuring light transmission across the second photo mask. The method can include determining the second wafer level critical dimension distribution based on the contributions to the second wafer level critical dimension distribution from the second photo mask and the scanner. The second wafer level critical dimension distribution can be determined without measuring a critical dimension on a wafer after the contribution to the wafer level critical dimension distribution from the scanner is determined. The method can include adjusting a parameter of the scanner based on the second wafer level critical dimension distribution when using the second photo mask to improve wafer level critical dimension uniformity. Adjusting a parameter of the scanner can include adjusting a dosage of illumination provided by the scanner. The wafer level critical dimension distribution can provide, for example, information about line-width size distribution of lines patterned on the wafer, information about a distribution of a size of a feature on the wafer, in which multiple instances of the feature are repeated across the wafer, or information about a distribution of contact hole sizes on the wafer. Determining the contribution to the wafer level critical dimension distribution from the scanner can include subtracting the contribution to the wafer level critical dimension distribution from the photo mask from the measured wafer level critical dimension uniformity distribution. The method can include measuring the wafer level critical dimension uniformity distribution.

In general, in another aspect, a method includes determining a contribution to a wafer level critical dimension distribution from a stepper of a lithography system based on measured wafer level critical dimension uniformity distribution and a contribution to the wafer level critical dimension distribution from a photo mask.

In general, in another aspect, a method includes determining a contribution to a critical dimension distribution of a substrate from a scanner of a lithography system based on measured critical dimension uniformity distribution of the substrate and a contribution to the critical dimension distribution of the substrate from a photo mask.

Implementations of the method may include one or more of the following features. The method can include determining the contribution to the critical dimension distribution of the substrate from the photo mask by measuring light transmission across the photo mask. Determining the contribution to the substrate level critical dimension distribution from the photo mask can include determining a transmittance variation distribution of the photo mask, and determining the contribution to the substrate level critical dimension distribution from the photo mask based on the transmittance variation distribution of the photo mask. Determining the contribution to the substrate level critical dimension distribution from the photo mask based on the transmittance variation distribution of the photo mask can include applying a correction factor to the transmittance variation distribution of the photo mask, the correction factor being based on a linear ratio between substrate level critical dimension variations and transmission variations. Determining the transmittance variation distribution of the photo mask can include measuring the transmittance at one location in each of a plurality of regions of the photo mask, each region having a pattern corresponding to a die, calculating an average of the measurement values for corresponding locations of the plurality of regions, for each measurement value, calculating a ratio between the measurement value and the average, and determining the transmittance variation distribution of the photo mask based on the ratios.

The method can include measuring the transmittance at a plurality of locations in each of the plurality of regions, each location in any region having a corresponding location in each of the other regions, for each group of corresponding locations in the plurality of regions, calculating an average of the transmittance for the group of corresponding locations, for each location in the group, calculating a ratio between the transmittance of the location and the average transmittance for the group, and determining the transmittance variation distribution of the photo mask based on the ratios. Measuring the light transmission can include performing transmission measurements at a plurality of locations on the photo mask using a non-imaging tool to generate transmission information.

The method can include determining a contribution to a second substrate level critical dimension distribution from a second photo mask. The first substrate level critical dimension distribution and the second substrate level critical dimension distribution can be associated with different layers of a same substrate. The first and second substrate level critical dimension distributions can be associated with different substrates. Determining a contribution to a second substrate level critical dimension distribution can include determining a contribution to a second substrate level critical dimension distribution from a second photo mask by measuring light transmission across the second photo mask. The method can include determining the second substrate level critical dimension distribution based on the contributions to the second substrate level critical dimension distribution from the second photo mask and the scanner. The second substrate level critical dimension distribution can be determined without measuring a critical dimension on a substrate after the contribution to the substrate level critical dimension distribution from the scanner is determined. The method can include adjusting a parameter of the scanner based on the second substrate level critical dimension distribution when using the second photo mask to improve substrate level critical dimension uniformity. Adjusting a parameter of the scanner can include adjusting a dosage of illumination provided by the scanner. The substrate level critical dimension distribution can provide, for example, information about line-width size distribution of lines patterned on the substrate, information about a distribution of a size of a feature on the substrate, in which multiple instances of the feature are repeated across the wafer, or information about a distribution of contact hole sizes on the substrate. Determining the contribution to the substrate level critical dimension distribution from the scanner can include subtracting the contribution to the substrate level critical dimension distribution from the photo mask from the measured substrate level critical dimension uniformity distribution. The method can include measuring the substrate level critical dimension uniformity distribution. Determining the contribution to the critical dimension distribution of the substrate can include determining the contribution to the critical dimension distribution of a semiconductor wafer or a flat panel display substrate.

In general, in another aspect, a method includes determining a contribution to a critical dimension distribution of a substrate from a stepper of a lithography system based on measured critical dimension uniformity distribution of the substrate and a contribution to the critical dimension distribution of the substrate from a photo mask.

In general, in another aspect, a system includes a photo mask transmission measurement sub-system to measure light transmission across a photo mask; and a computing system configured to determine a contribution to a critical dimension distribution of a substrate from the photo mask based on the measured light transmission across the photo mask, and determine a contribution to the critical dimension distribution of the substrate from a scanner based on measured critical dimension uniformity distribution of the substrate and the contribution to the critical dimension distribution of the substrate from the photo mask.

Implementations of the system may include one or more of the following features. The substrate can include a semiconductor wafer or a flat panel display substrate. The computing system can be configured to calculate, for each of a plurality of transmittance values measured from a plurality of locations on the photo mask, a ratio between the transmittance value and an average of the plurality of transmittance values, and determine the contribution to the critical dimension distribution of the substrate from the photo mask based on the ratios.

In general, in another aspect, a system includes a photo mask transmission measurement sub-system to measure light transmission across a photo mask; and a computing system configured to determine a contribution to a critical dimension distribution of a substrate from the photo mask based on the measured light transmission across the photo mask, and determine a contribution to the critical dimension distribution of the substrate from a stepper based on measured critical dimension uniformity distribution of the substrate and the contribution to the critical dimension distribution of the substrate from the photo mask.

In general, in another aspect, an apparatus includes a computer storage medium storing instructions that, when executed by data processing apparatus, cause the data processing apparatus to perform operations comprising: determining a contribution to a wafer level critical dimension distribution from a scanner of a lithography system based on measured wafer level critical dimension uniformity distribution and a contribution to the wafer level critical dimension distribution from a photo mask.

In general, in another aspect, an apparatus includes a computer storage medium storing instructions that, when executed by data processing apparatus, cause the data processing apparatus to perform operations comprising: determining a contribution to a wafer level critical dimension distribution from a stepper of a lithography system based on measured wafer level critical dimension uniformity distribution and a contribution to the wafer level critical dimension distribution from a photo mask.

DETAILED DESCRIPTION

Figure 1:
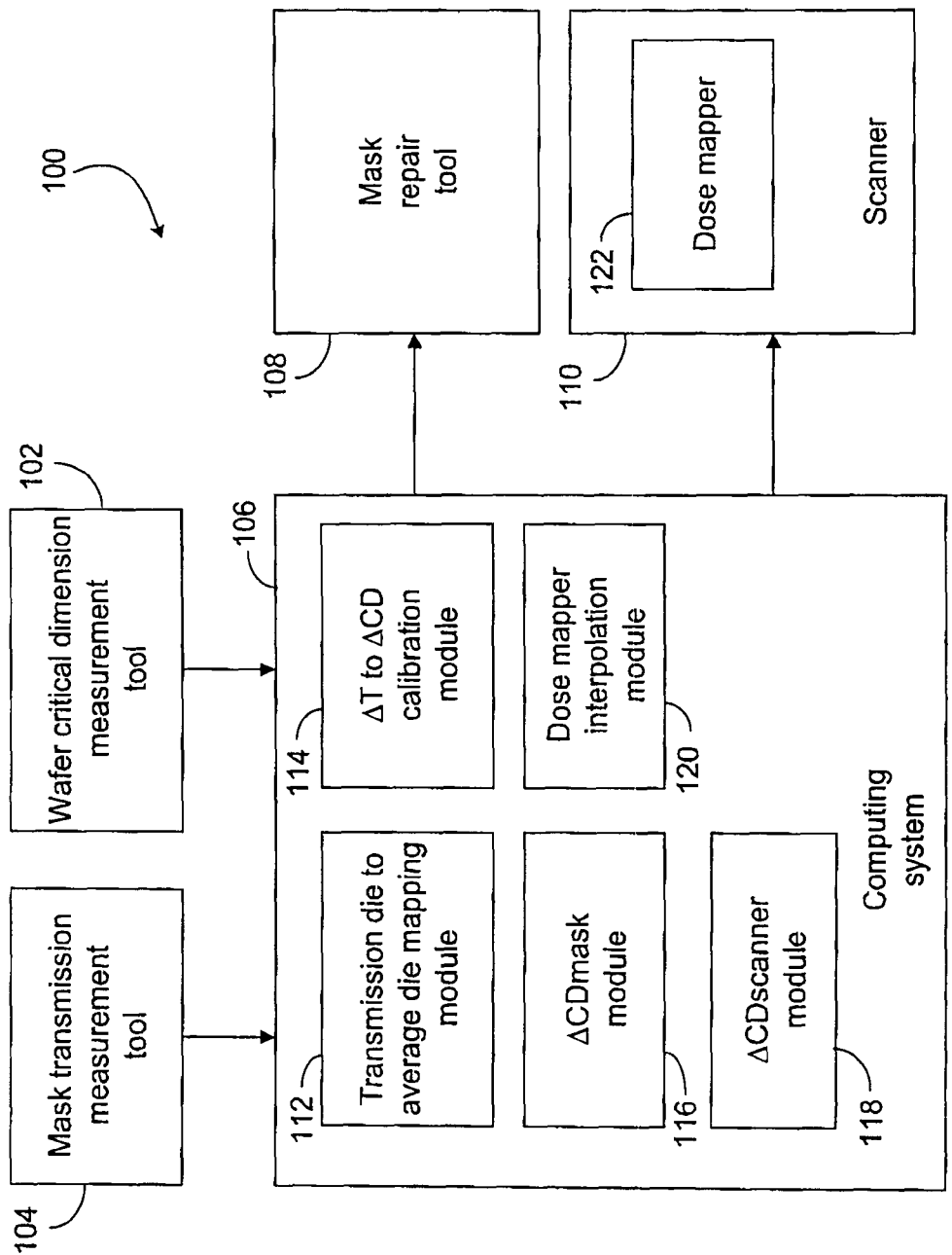
FIG. 1 is a block diagram of a system for correcting critical dimension uniformity.

A system for correcting critical dimension uniformity in a lithography system is provided. A circuit layer on a semiconductor wafer can be fabricated by using a scanner of the lithography system to project light through a photo mask (or reticle) to transfer a pattern on the photo mask to the wafer. The features fabricated on the wafer are affected by both the photo mask and the scanner, so a critical dimension variation distribution on the wafer (referred to as $\Delta CD_{wafer}$) is affected by both the photo mask and the scanner. As an approximation, the $\Delta CD_{wafer}$ can be regarded as a sum of a contribution to the $\Delta CD_{wafer}$ from the photo mask (the contribution being referred to as $\Delta CD_{mask}$) and a contribution to the $\Delta CD_{wafer}$ from the scanner (the contribution being referred to as $\Delta CD_{scanner}$), as shown in the equation below:

$$\Delta CD_{wafer} = \Delta CD_{mask} + \Delta CD_{scanner}. \quad \text{(Equation 1)}$$

In the equation above, $\Delta CD_{mask}$ and $\Delta CD_{scanner}$ relate to wafer level critical dimension variations. The values for $\Delta CD_{wafer}$ can be measured using, for example, scanning electron microscopy. The values for $\Delta CD_{mask}$ can be determined by measuring light transmission across the photo mask to determine a transmission uniformity distribution of the mask, multiplied by a conversion factor, as described below. After $\Delta CD_{wafer}$ and $\Delta CD_{mask}$ are determined, $\Delta CD_{scanner}$ can be determined by subtracting $\Delta CD_{mask}$ from $\Delta CD_{wafer}$ according to Equation 1. The values for $\Delta CD_{mask}$ can also be determined by other methods, for example, mask optical critical dimension (OCD) measurements, mask critical dimension scanning electron microscopy (CDSEM), aerial image measurement system (AIMS™), or wafer level critical dimension metrology (WLCD).

Information about $\Delta CD_{mask}$ and $\Delta CD_{scanner}$ can be useful in improving the lithography system. For example, if $\Delta CD_{mask}$ is larger than $\Delta CD_{scanner}$, one can put more effort in improving mask quality, perhaps by repairing a damaged photomask-mask with undesired defect (e.g., due to critical dimension variation, scratch, hole, lack of material, excessive material or other unintentional reason) in a chrome layer by writing a diffractive optical element (DOE) or a shading element (SE) in front of the undesired defect to improve the critical dimension uniformity of the mask. If $\Delta CD_{scanner}$ is larger than $\Delta CD_{mask}$, one can put more effort in improving scanner quality, perhaps by adjusting dosage of illumination during the scanner process.

Separating the contribution to $\Delta CD_{wafer}$ from the mask and scanner has the advantage that one can apply corrective measures accurately when switching among different masks or scanners. Suppose a mask and a scanner is used to fabricate a pattern on a wafer, $\Delta CD_{wafer}$ is measured, and the scanner is adjusted based on information about $\Delta CD_{wafer}$ (without using information about $\Delta CD_{mask}$) to improve the uniformity of critical dimension distribution on the wafer. The adjustments to the scanner may be fine for this particular mask, but not be appropriate when the scanner is used with another mask because the adjustments had taken into account the contributions to $\Delta CD_{wafer}$ from the mask, and different masks may contribute differently to the $\Delta CD_{wafer}$. By comparison, when $\Delta CD_{scanner}$ and $\Delta CD_{mask}$ are both determined, one can separately adjust the scanner and mask to reduce the contributions to $\Delta CD_{wafer}$ from the scanner and mask, respectively.

After contributions to wafer critical dimension variations from various masks and various scanners are determined, one can direct a mask to a specific scanner based on the best optimal combination of the mask and scanner signatures to provide the best wafer critical dimension uniformity.

Referring to FIG. 1, a system 100 for correcting critical dimension uniformity includes wafer critical dimension measurement tool 102 for determining a critical dimension variation distribution on a wafer, a mask transmission measurement tool 104 for determining a transmission variation distribution of a photo mask, a computing system 106 for determining $\Delta CD_{mask}$ and $\Delta CD_{scanner}$ based on information provided by the wafer critical dimension measurement tool 102 and the mask transmission measurement tool 104. Information about $\Delta CD_{mask}$ is provided to a mask repair tool 108 for repairing a mask to improve the critical dimension uniformity of the mask. Information about $\Delta CD_{scanner}$ is provided to a scanner 110 to improve the critical dimension uniformity of the scanner 110.

In this description, the various distributions can be, for example, a matrix of measured or calculated values. Thus, for example, determining a critical dimension variation distribution on a wafer may refer to determining a matrix of measured or calculated critical dimension variation values corresponding to an array of sample points across the wafer.

The computing system 106 includes a transmission die-to-average-die variation ($\Delta T_{D2AD}$) mapping module 112 that generates mask transmission die-to-average-die maps based on the mask transmission information provided by the mask transmission measurement tool 104. The mask transmission measurement tool 104 measures the transmittance at several measurement points on a mask. The $\Delta T_{D2AD}$ mapping module 112 determines the average transmittance of the measurement points that are designed to have identical patterns and identical transmittance. The average transmittance is used as a reference for comparison with individual measurements. For each measurement point, the module 112 calculates a ratio between the transmittance measured at the measurement point and the corresponding average transmittance. For each measurement point, the deviation of the ratio from 100% provides a measure of the deviation of the transmittance at the measurement point relative to a reference value, which is the average transmittance value.

For example, suppose the mask has patterns that correspond to six dies to be fabricated on a wafer. In this example, the mask has six regions, each region having a pattern that corresponds to one die. For simplicity, each region will be referred to as a die. The term "die" depending on context may refer to a region on a mask, a chip on a wafer, or a region of another type of substrate in which different dies are designed to have identical patterns and have the same transmittance profiles. Assume that four measurement points are selected for each die. The measurement points can be selected at locations where there are critical features.

Suppose the transmittance measurements at the four measurement points in the six dies are denoted Ai, Bi, Ci, and Di (i=1 to 6), in which A1, B1, C1, and D1 are the transmittance values at the four measurement points in the first die, A2, B2, C2, and D2 are the transmittance values at the four measurement points in the second die, and so forth.

The $\Delta T_{D2AD}$ mapping module 112 calculates the average transmittance $\overline{A}$ for the measurement points Ai (i=1 to 6): $\overline{A}=(A1+A2+A3+A4+A5+A6)/6$. The other average values $\overline{B}$, $\overline{C}$, and $\overline{D}$ are calculated in a similar manner. The average values $\overline{A}$, $\overline{B}$, $\overline{C}$ and $\overline{D}$ represent an average die on the photo mask and can be used as references to which individual measurements are compared.

The $\Delta T_{D2AD}$ mapping module 112 calculates die-to-average-die values $Ai/\overline{A}$, $Bi/\overline{B}$, $Ci/\overline{C}$, and $Di/\overline{D}$ (i=1 to 6) for the measurement points. Each die-to-average-die value is a unitless value that represents a percentage change in the transmittance at a measurement point relative to a reference transmittance (i.e., the average transmittance). For a perfect photo mask in which the transmittance at all corresponding measurement points are the same, the die-to-average-die values will all be 100%. However, due to critical dimension variation, defects or haze in the photo mask or other factors, such as defects in the pellicle protecting the photo mask or impurities attached to the surfaces of the photo mask and the pellicle, the die-to-average-die values may vary from one measurement point to another.

The $\Delta T_{D2AD}$ mapping module 112 calculates die-to-average-die variation values $Ai/\overline{A}$—100%, $Bi/\overline{B}$—100%, $Ci/\overline{C}$—100%, and $Di/\overline{D}$—100% (i=1 to 6) for all the measurement points. Each die-to-average-die variation value represents a deviation from a reference die-to-average-die value (which is 100%).

There is a correlation between variations in the transmittance of the mask and variations in the critical dimension on the wafer. As an approximation, it can be assumed that there is a linear relationship between transmission die-to-average-die variations and wafer critical dimension variations:

$$\alpha G_i = M_i. \quad \text{(Equation 2)}$$

In the equation above, $G_i$ represents the transmission die-to-average-die variation at the i-th measurement point, $M_i$ represents the contribution to wafer critical dimension variation from the i-th measurement point of the mask, and $\alpha$ is a calibration factor (or conversion factor) that converts transmission die-to-average-die variation values to wafer critical dimension variation values. In some examples, the unit of $G_i$ is percentage, and the unit of $M_i$ is nanometer.

The computing system 106 includes a $\Delta T_{D2AD}$ to $\Delta CD_{D2AD}$ calibration module 114 that determines the calibration factor $\alpha$. In some implementations, the calibration module 114 determines the calibration factor $\alpha$ using the equation below:

$$\alpha = (\delta * G)/|G|^2. \quad \text{(Equation 3)}$$

In Equation 3, $\delta$ represents the wafer critical dimension variations, and G represents the mask transmission die-to-average-die variations. Both $\delta$ and G are vectors, each having p dimensions, where p is the number of measurement points. For G, the component of each dimension $G_i$ (i=1 to p) is equal to the transmission die-to-average-die variation at the i-th measurement point. For $\delta$, the component of each dimension $\delta_i$ (i=1 to p) is equal to the i-th wafer critical dimension variation value that corresponds to the i-th measurement point on the mask.

Equation 3 can also be used to determine the wafer critical dimension variations from other sources of critical dimension uniformity measurements, for example, measurements based on mask optical critical dimension (OCD), mask critical dimension scanning electron microscopy (CDSEM), or aerial imaging.

The computing system 106 includes a $\Delta CD_{mask}$ module 116 that determines the contribution to the wafer critical dimension variation from the mask using Equations 2 and 3.

The computing system 106 includes a $\Delta CD_{scanner}$ module 118 that determines the contribution to the wafer critical dimension variation from the scanner ($\Delta CD_{scanner}$) using Equation 1.

The computing system 106 includes a dose mapper feeding module 120 that interpolates $\Delta CD_{scanner}$ data to generate data for use by a dose mapper 122 of the scanner 110 and converts data presentation. Interpolation is used because the resolution of the dose mapper 122 may be different from the resolution of the measurement points on the mask.

Figure 2:
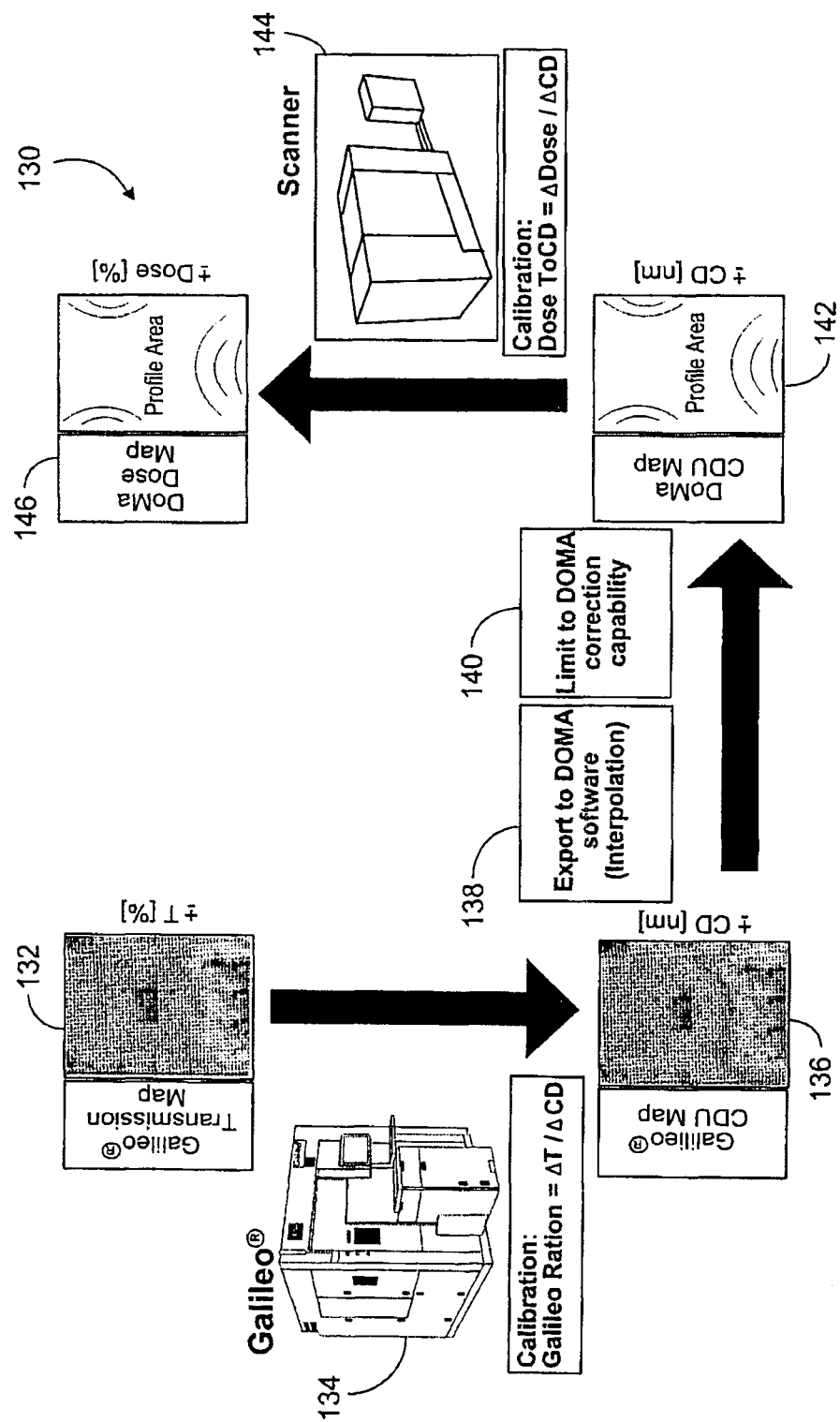
FIG. 2 is a diagram of a work flow for compensating critical dimension uniformity for photo resist on a wafer.

FIG. 2 is a diagram of a work flow 130 for compensating critical dimension uniformity for photo resist on the wafer using a Carl Zeiss Galileo® transmission measurement tool to provide data to a scanner dose mapper. In the work flow 130, a transmission die-to-average-die variation map is generated (132). A calibration factor $\alpha$ that converts the transmission die-to-average-die variation values to wafer critical dimension variation values is determined (134). Based on the transmission die-to-average-die variation map and the calibration factor $\alpha$, a $\Delta CD_{mask}$ map (which represents the contribution to the wafer critical dimension variation from the mask) is generated (136). Based on the $\Delta CD_{mask}$ map, a $\Delta CD_{scanner}$ map (which represents the contribution to the wafer critical dimension variation from the scanner) is generated 142.

In some implementations, when generating the $\Delta CD_{scanner}$ map, data for the $\Delta CD_{mask}$ map is provided to a dose mapper software to perform interpolation to match the resolution of the dose mapper (138), and constraints representing the dose mapper correction capability are applied to the data (140). A calibration factor ΔDose-to-ΔCD for converting critical dimension variation to dosage variation is determined (144). Based on the $\Delta CD_{scanner}$ map and the ΔDose-to-ΔCD calibration factor, a dose map representing the adjustments to dosage of illumination is determined (146).

The work flow 130 can reduce the time used for wafer printing and wafer critical dimension measurement (which together may be as long as 5 to 8 hours) that are needed to set up the wafer critical dimension recipe and critical dimension data collection for the dose mapper. In an example conventional method that does not use the work flow 130, determining the adjustments to the dose mapper may require the user to identify measurement features with suitable requirement design pitch and critical dimension using an electron beam lithography system for each unique tapeout. There may be occasions where only limited suitable features can be found on the devices, which may create situations of unrealistic representation of the mask systematic error. By comparison, using the work flow 130 in which wafer critical dimension variation mapping is determined based on mask transmission measurements, a faster turn around time can be achieved with repeatable accuracy. It is easy to implement the work flow 130 using a production reticle, since a production wafer is not needed for critical dimension measurement. Correction of dosage of illumination can be applied on the first production wafer, and no unique or extra monitoring feature is needed on the production reticle for data collection. When a new reticle is received, the new reticle can be used in a production run without the need for measurements of wafer critical dimensions.

Figure 3:
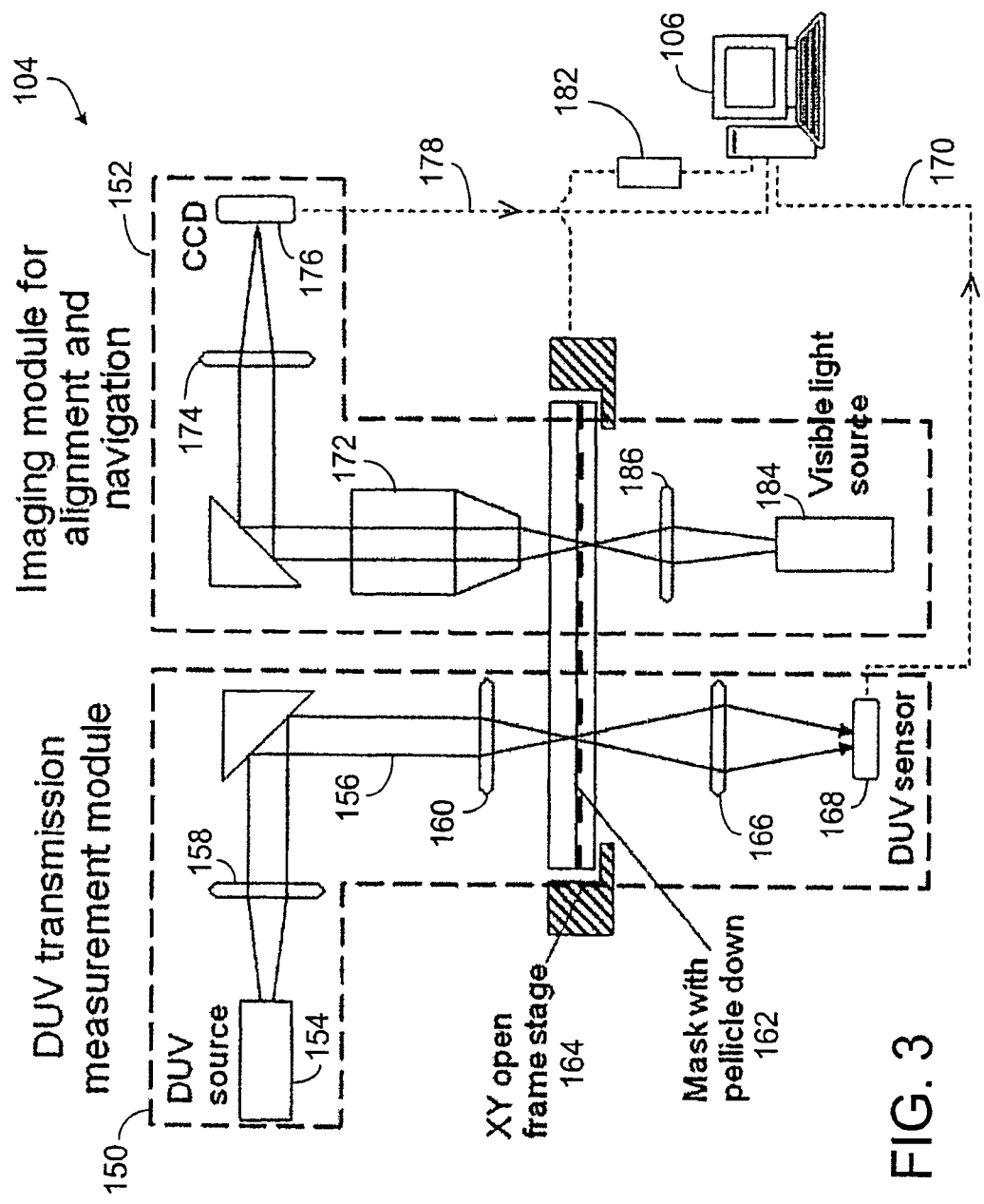
FIG. 3 is a diagram of an example mask transmission measurement tool.

FIG. 3 is a diagram of an example mask transmission measurement tool 104. The tool 104 includes a deep ultraviolet (DUV) transmittance measurement module 150 and an imaging module for alignment and navigation 152. The DUV transmittance measurement module 150 includes a wideband DUV light source 154 that generates a DUV beam 156, which is collimated by a condenser lens 158. A second condenser lens 160 focuses the DUV beam 156 to a small spot size on the front side of a photo mask 162. The photo mask 162 is installed on a moving XY stage 164. DUV illuminated spot is projected by a collecting lens 166 onto a fast DUV detector 168. Signals from the DUV detector 168 is transferred through a signal line 170 to a computer system 106 for data acquisition and mapping.

The imaging module 152 enables alignment and navigation across the photo mask 162. The imaging module 152 includes an objective lens 172, a tube lens 174, and a charged coupled device (CCD) camera 176. Images from the CCD camera 176 of alignment marks on the photo mask 162 at the focus of objective lens 172 are transferred through a signal line 178 to the computing system 106, and exact coordinates of all points are registered by stage control 182, for the full mapping process. Imaging module 152 receives the light for imaging from a light source 184, which is imaged to the objective lens 172 focal point by a condenser lens 186.

In some implementations, the transmittance measurement tool 104 is a non-imaging tool, which is a tool in which a one-to-one correspondence between an object and an image does not exist. Since there is not a one-to-one correspondence between the object and the image, points of a source collected at a target plane are generally not distinguishable and an image is not formed at a detector. While, generally, in a non-imaging tool, an image is not formed at the detector, unintentional correspondence between an object and an image at the target plane may occur and/or a poor image could be formed. However, in the measurement and mapping system any such image would not be detected by the non-imaging detector or used to generate the transmittance or critical dimension distribution.

The transmittance measurement tool 104 can measure the transmittance of a beam having a large spot size, in which the average transmittance over the area of the spot is measured. An example of the transmittance measurement tool 104 is Carl Zeiss Galileo® tool, available from Carl Zeiss SMS GmbH, Jena, Germany. By using a non-imaging detection method, a fast and sensitive detection device 168 can be used, such as a photodiode, a photomultiplier tube (PMT), or a phototube. The detection device 168 can have a wide dynamic range of more than five orders of magnitude and a high level of signal-to-noise ratio. Each measurement using the detection device 168 may take a fraction of a second, and averaging several measurements can increase the signal-to-noise ratio to accuracy levels of about 0.1% transmittance or better. High accuracy of transmittance variation measurements can be transformed to the critical dimension distribution map according to a linear ratio that is found to exist between critical dimension variations and transmittance variations, as in Equation 2, as described in more detail in PCT application PCT/EP2009/050004, filed on Jan. 2, 2009, herein incorporated by reference. The signals from the DUV detector 164 are stored and processed by the computing system 106 as described above.

Figure 4:
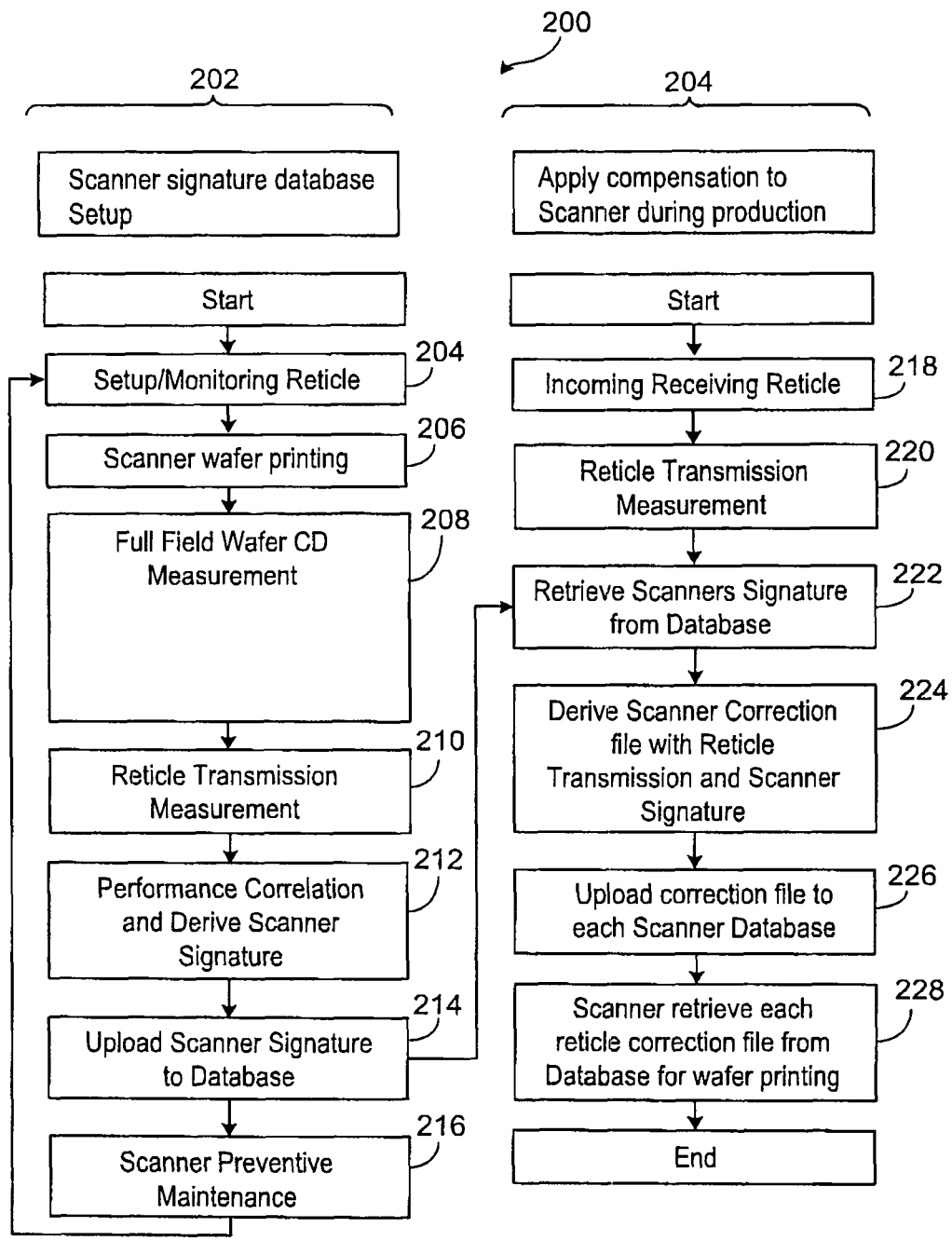
FIG. 4 is a flow diagram of an example scanner signature setup and production reticle correction file generation process.

FIG. 4 is a flow diagram of an example scanner signature setup and production reticle correction file generation process 200 for obtaining a scanner signature using a monitoring reticle. The process 200 includes two parts: setting up a scanner signature database 202 and applying compensation to scanner during production 204. Before starting production runs for a new device tape out, various scanner signatures are set up using a monitoring reticle (204). Various scanners are used to print on wafers (206), and full field wafer critical dimension measurement data are collected for various scanners (208). Reticle transmission measurements are performed (210). Correlation between reticle transmission map and wafer critical dimension map are performed and a specific scanner signature is derived (212). The specific scanner signature for a specific layer and wafer process is stored in the database for production runs (214). Periodic update of the scanner signature is conducted, for example, after each preventive maintenance (216).

Before a new production run, one or more new production reticles are received (218), and for each new reticle, transmission measurements are performed on the new reticle (220). The scanner signature is retrieved from the database (222), and a scanner correction file that is specific for the new reticle is derived based on the reticle transmission measurements and the scanner signature (224). The scanner correction file for the new reticle is stored in the scanner database (226). When a particular reticle is used for wafer printing, the scanner retrieves the scanner correction file for the particular reticle, and corrects the scanner profile according to the scanner correction file during wafer printing.

Figure 5:
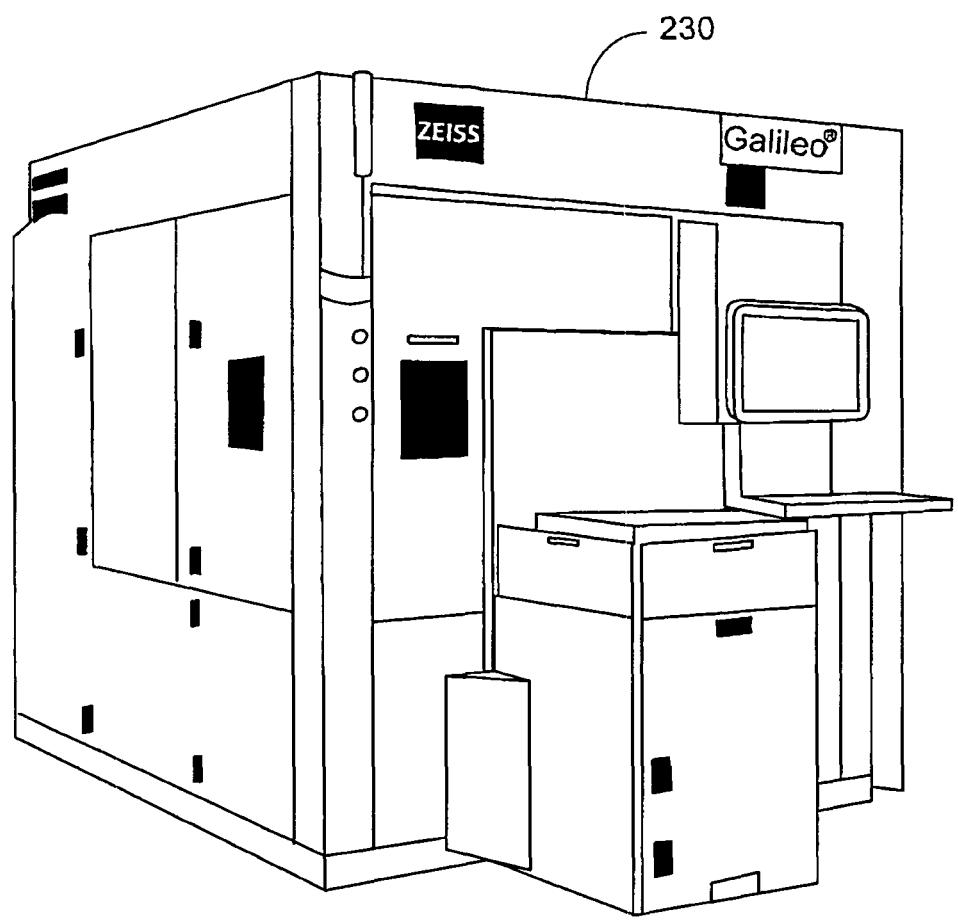
FIG. 5 is a diagram of a non-imaging transmission measurement system.

Referring to FIG. 5, the Galileo® tool 230 is a non-imaging transmission measurement system with high transmission repeatability and high signal to noise (SNR) ratio. The Galileo® tool 230 uses a deep ultra-violet (UV) lamp as the light source, which helps to obtain a stable and low noise illumination. The Galileo® tool 230 can scan various measurement locations across the mask using a DUV spot of about 180 μm to 600 μm diameter (full width and half maximum), resulting in a transmission value on each location that is averaged over the area of the spot. In some examples, a mask transmission map can be generated within 30 minutes using the Galileo® tool 230. Higher lateral resolution can also be generated.

Figure 6:
FIG. 6 is an example mask transmission uniformity map.

FIG. 6 shows an example mask transmission uniformity map 240 generated by the Galileo tool 230. The mask transmission uniformity map correlates to the wafer critical dimension uniformity, as expressed in Equation 2. In the example of FIG. 6, the critical features covering the averaging area of the spot are spread over the mask on several locations.

Equation 1 represents the approximate relationship between the critical dimension variation distribution on the wafer ($\Delta CD_{wafer}$), the contribution from the photo mask, and the contribution from the scanner. This relationship can be expressed differently as follows:

$$\Delta CD_{Wafer} = \left( MEEF \times \frac{\Delta CD_{Mask}}{4} \right) + \Delta CD_{Scanner} \quad \text{(Equation 4)}$$

In Equation 4, $\Delta CD_{wafer}$ is the same as in Equation 1, but $\Delta CD_{mask}$ refers to the contribution from the mask as determined at the mask level, and $\Delta CD_{scanner}$ refers to the contribution from the scanner as determined at the scanner level. In this example, the photo mask has a 4:1 reduction ratio in which the feature sizes on the mask are four times the corresponding feature sizes on the wafer. When the feature size of the mask is reduced by a factor of 4, the error contributed by the mask is not necessarily reduced by 4. In Equation 4, a mask error enhancement factor (MEEF) is applied to convert the mask level error to the wafer level error.

Figure 8:
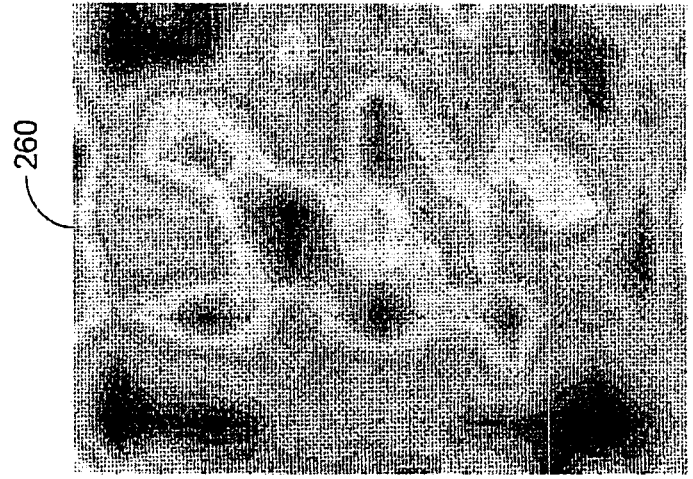
FIG. 8 is an example mask transmission variation map.
Figure 7:
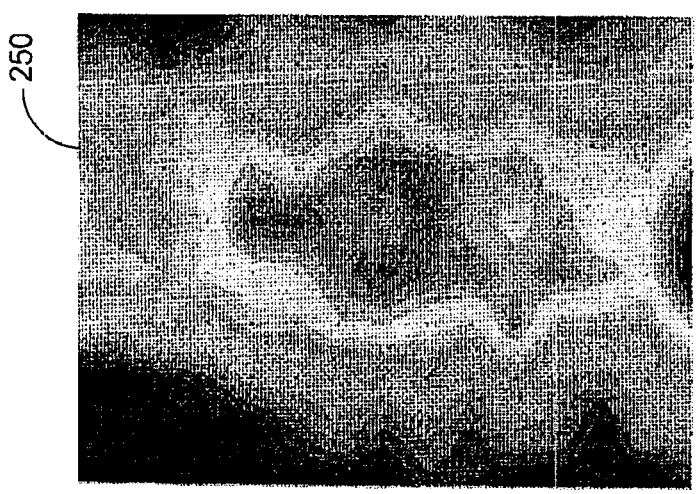
FIG. 7 is an example measured wafer critical dimension variation map.

FIG. 7 show an example measured wafer critical dimension variation map 250. FIG. 8 shows an example mask transmission variation map 260. In some examples, the mask transmission measurement tool 104 (FIG. 1) can generate high resolution measurement data in which the measurements are made from a large number (for example, several thousands) of measurement points. Due to cost and time constraints, the wafer critical dimension data are usually limited to a smaller number (for example, 150) measurement points per wafer. An interpolation is applied to either up-sample the measured wafer critical dimension variation or down-sample the mask transmission variation data so that the two sets of data can be correlated with each other.

Figure 9:
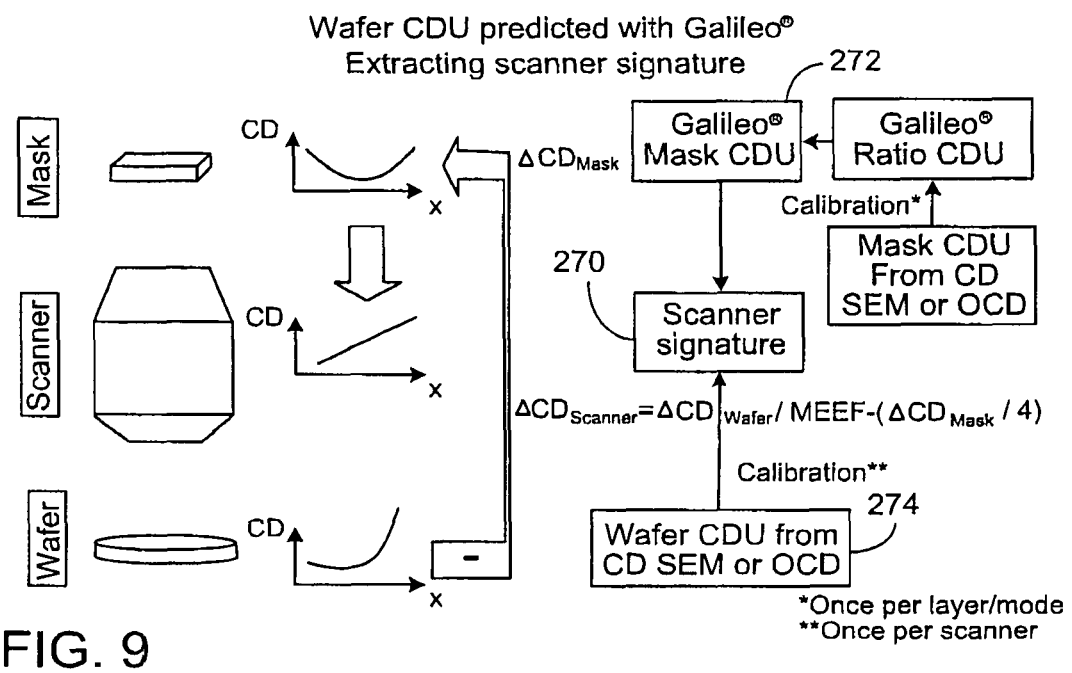
FIG. 9 shows a process for deriving a scanner signature.

Referring to FIG. 9, a scanner signature 270 can be derived in a first approximation using a mask with small critical dimension variations and wafer prints. The scanner signature 270 is determined by subtracting critical dimension variation contribution from mask from the critical dimension variations measured on the wafer 274.

Figure 10:
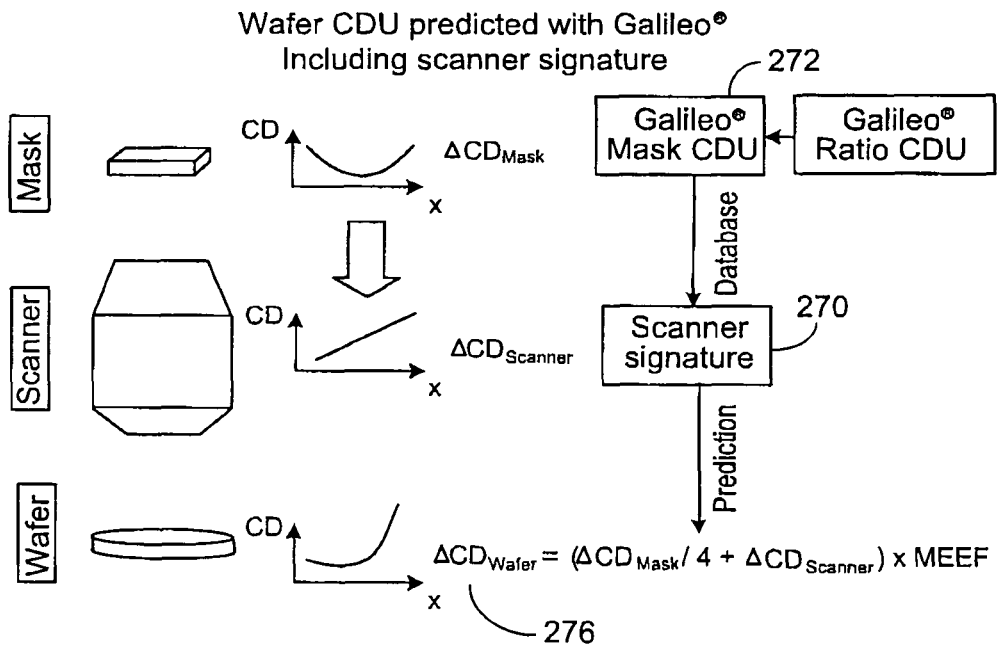
FIG. 10 shows a process for predicting wafer critical dimension variation.

Referring to FIG. 10, the scanner signature 270 and the critical dimension variation contribution from the mask 272 can be used to predict the wafer critical dimension variation 276 without actually measuring the wafer critical dimensions.

Figure 11:
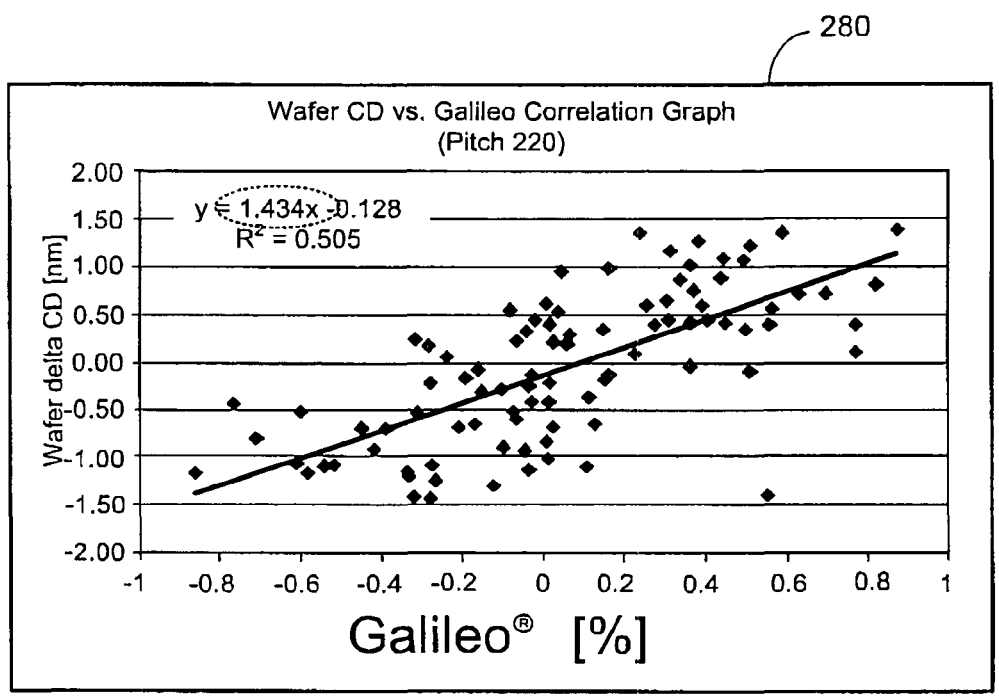
FIG. 11 is a graph showing a relationship between mask transmittance die-to-average-die variation and wafer critical dimension variation.

Referring to FIG. 11, a graph 280 shows a relationship between the mask transmittance die-to-average-die variation G (represented by the horizontal axis) and the wafer critical dimension variation M (represented by the vertical axis). Assuming a linear relationship between G and M, the calibration factor α can be determined using a least square fit method, resulting in Equation 3.

In the example of FIG. 11, the correlation between the wafer critical dimension variation data and the transmission variation data is 71% (R=√0.505=0.71) (R=√0.505=0.71) and the calibration factor α is 1.434 nm/%.

Figure 12:
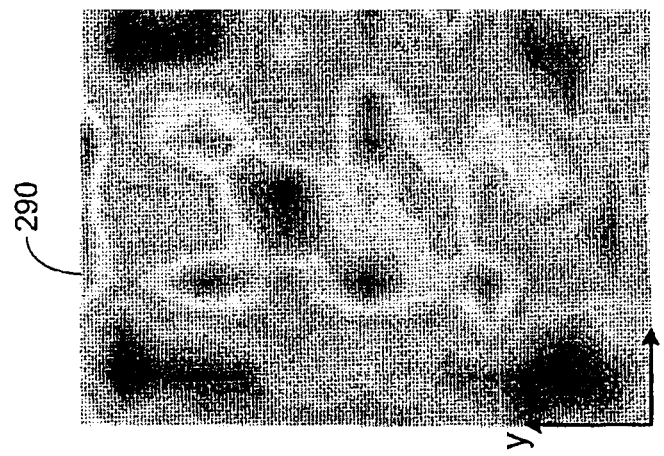
FIG. 12 shows an example mask transmission die-to-average-die variation map.
Figure 13:
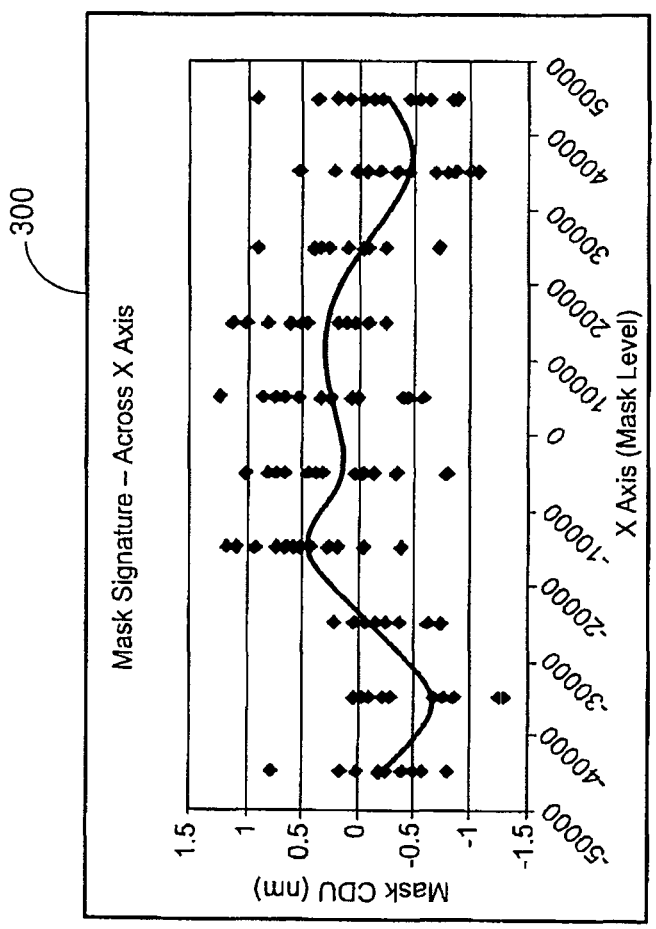
FIG. 13 shows a graph that represents the underlying data in FIG. 12.

FIG. 12 shows an example mask transmission die-to-average-die variation ($\Delta T_{D2AD}$) map 290. FIG. 13 shows a graph 300 that represents the same underlying data as in FIG. 12 but in a different format. In FIG. 13, the horizontal axis represents the x-axis on the mask, and the vertical axis represents $\Delta T_{D2AD}$. The graph 300 provides a snapshot of how $\Delta T_{D2AD}$ varies across the x-axis of the mask. In this example, by applying a calibration factor of about 1.45 (1.434 from FIG. 11), $\Delta CD_{mask}$ is calculated to be approximately 2.5 nm.

Figure 14:
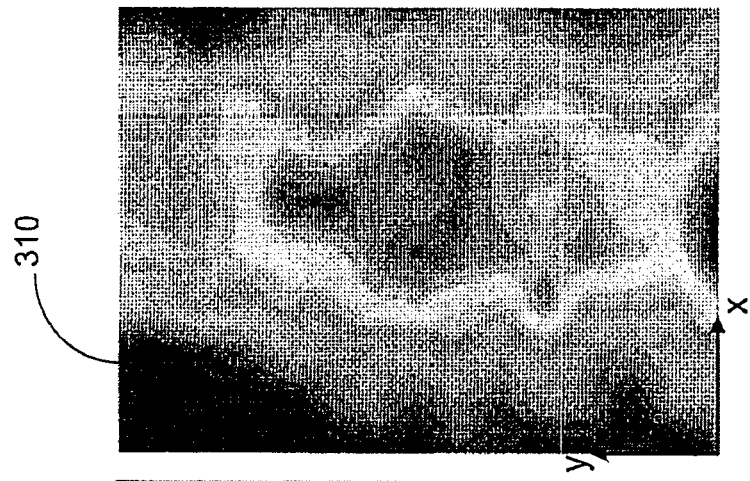
FIG. 14 shows an example wafer critical dimension variation map.
Figure 15:
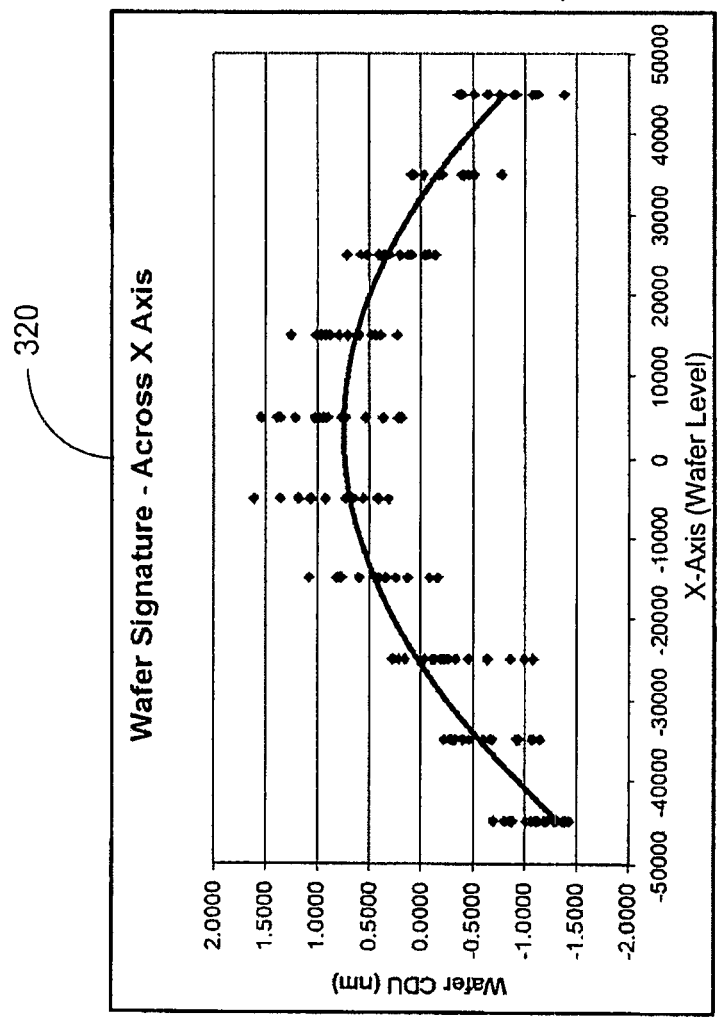
FIG. 15 shows a graph that represents the underlying data in FIG. 14.

FIG. 14 shows an example wafer critical dimension variation map 310 based on measurements from scanning electron microscopy. FIG. 15 shows a graph 320 that represents the same underlying data as in FIG. 14 but in a different format. In FIG. 15, the horizontal axis represents the x-axis on the wafer, and the vertical axis represents $\Delta CD_{wafer}$. The graph 320 provides a snapshot of how $\Delta CD_{wafer}$ varies across the x-axis of the wafer.

Figure 16:
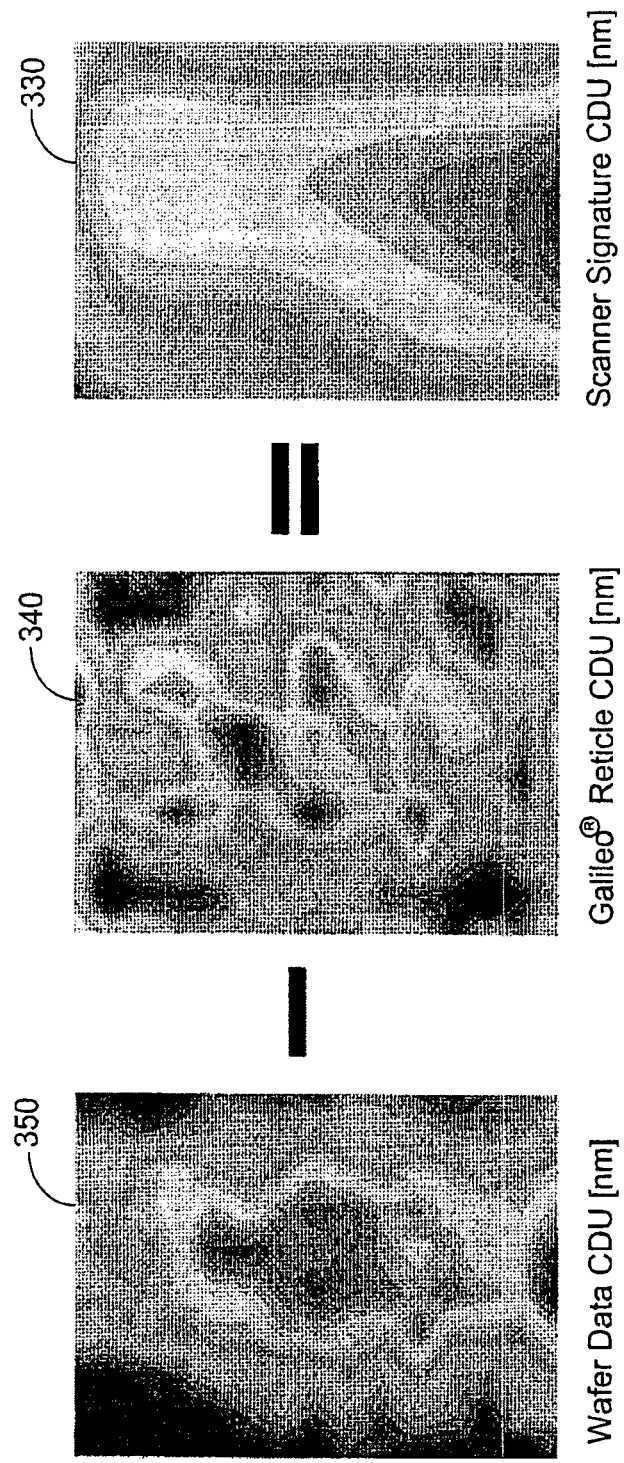
FIG. 16 shows that scanner signature $\Delta CD_{scanner}$ can be determined by subtracting $\Delta CD_{mask}$ from $\Delta CD_{wafer}$.

Referring to FIG. 16, as indicated in Equation 1, the scanner signature $\Delta CD_{scanner}$ (which is represented by a map 330) can be determined by subtracting $\Delta CD_{mask}$ (the contribution to the $\Delta CD_{wafer}$ from the photo mask, which is represented by a map 340) from $\Delta CD_{wafer}$ (the critical dimension variation distribution on the wafer, which is represented by a map 350).

Figure 17:
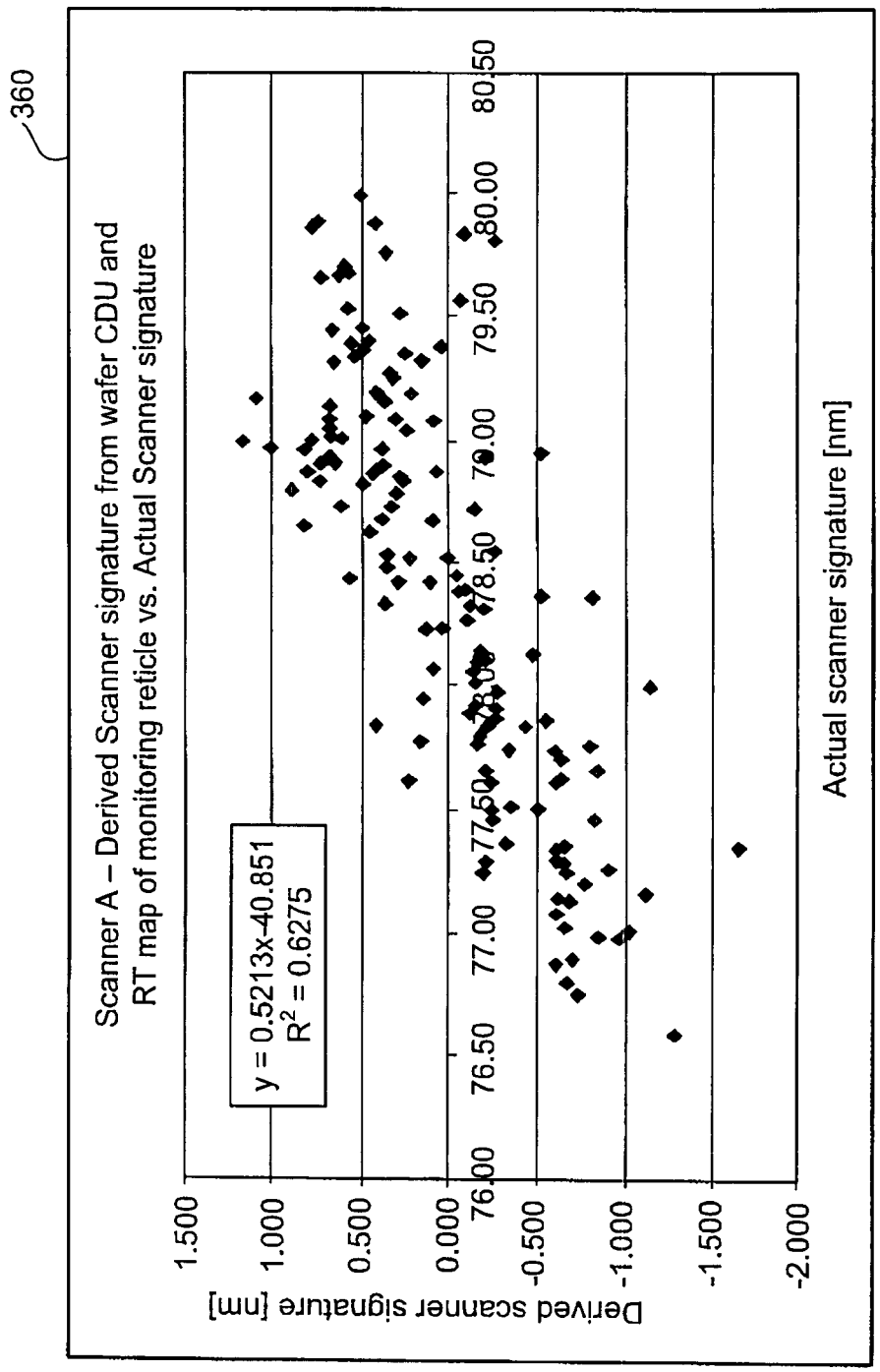
FIG. 17 shows an example graph indicating a correlation between derived scanner signature and measured scanner signature.

FIG. 17 shows an example graph 360 indicating a correlation between the scanner signature that is derived based on Equation 1 (represented by the horizontal axis) and the actual scanner signature obtained from standard across-slit uniformity measurement at wafer level (represented by the vertical axis). In this example, the correlation is about 80%.

Figure 18:
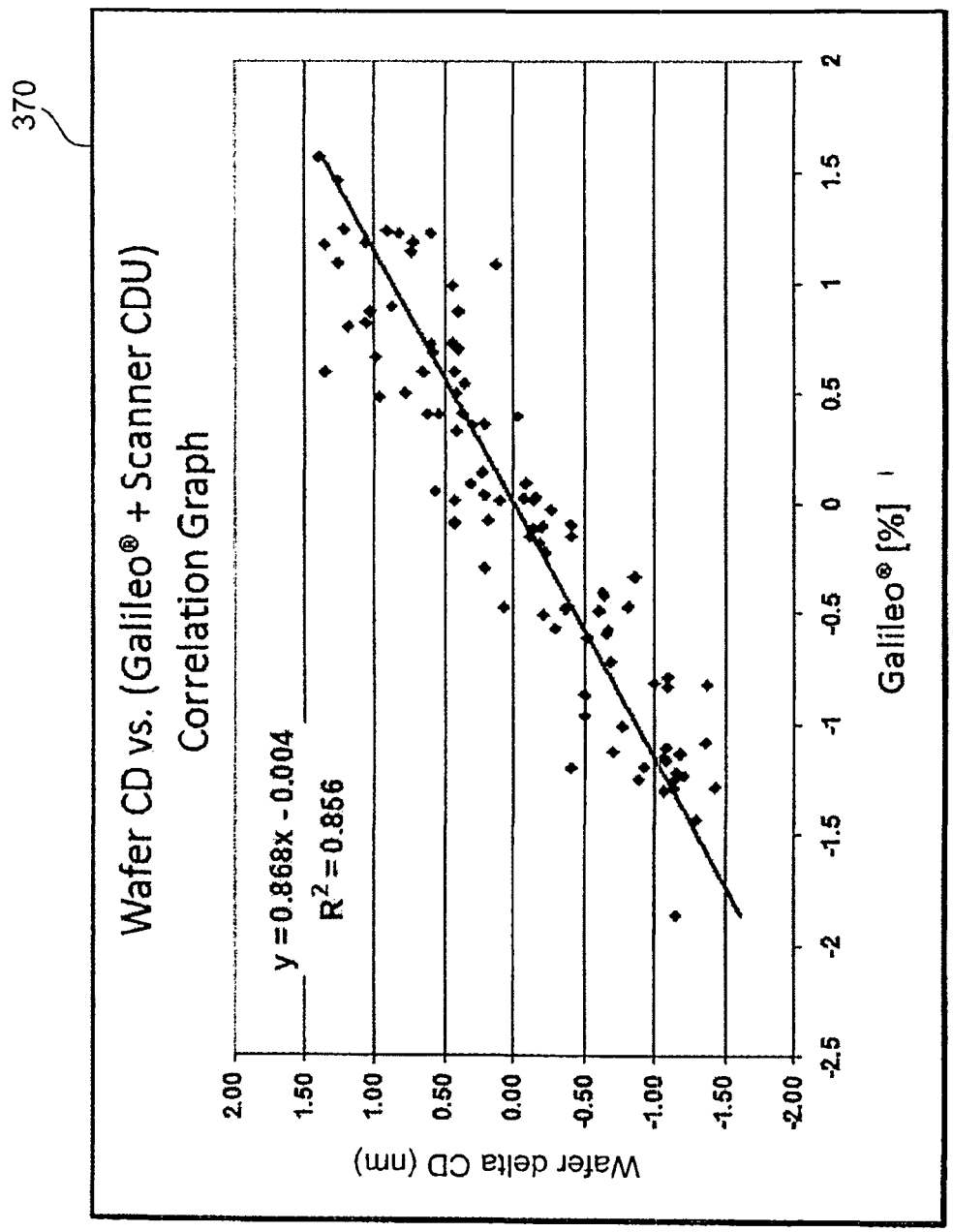
FIG. 18 shows an example graph indicating a correlation between wafer critical dimension variation data and mask transmission die-to-average-die variation data plus scanner signature.

FIG. 18 shows an example graph 370 indicating a correlation between wafer critical dimension variation data and mask transmission die-to-average-die variation data plus scanner signature for the same mask as in FIG. 11. After including the scanner signature, the correlation factor is improved to 92.5% (R=√0.856=0.925), as compared to 71% in FIG. 11.

Once a scanner signature is obtained, the scanner signature can be used to estimate the final wafer critical dimension uniformity by combining the scanner signature data with the mask transmission variation data. Combining the mask transmission variation map with its respective scanners signature, a specific dose mapper correction file for the mask can be derived and used for adjusting the illumination dosage (instead of using the wafer critical dimension variation data).

Figures 19, 20:
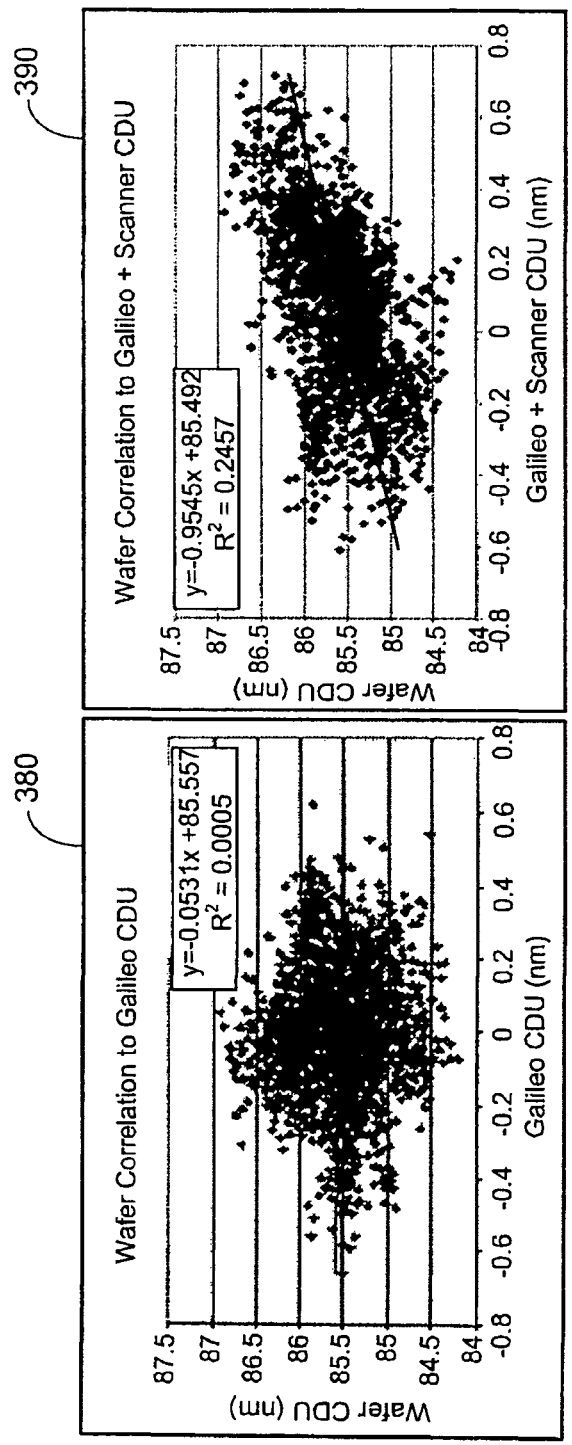
FIGS. 19 and 20 are graphs showing data illustrating an example in which the contribution to the wafer critical dimension variation from the mask is small, and the contribution from the scanner is large.

FIGS. 19 and 20 illustrate an example in which the contribution to the wafer critical dimension variation from the mask is small, and the contribution from the scanner is large. FIG. 19 is graph 380 having data points that indicate little correlation between the wafer critical dimension variation (represented by the vertical axis) and the mask transmission variation (represented by the horizontal axis) without taking into account of the scanner signature. FIG. 20 is a graph 390 having data points that indicate a certain amount of correlation (about 60%) between the wafer critical dimension variation and the sum of the mask transmission variation and scanner signature. In this example, the mask transmission variation data is not useful in correcting illumination dosage. On the other hand, it is useful to provide the scanner signature data to the dose mapper to adjust illumination dosage.

In some implementations, the scanner signature is determined based on one feature type (for example, line feature of a specific design pitch, multi-die reticle) of a monitoring reticle. A conversion factor can be applied to the scanner signature to convert the scanner signature for use on other types of reticles (for example, for relaxed design rules or single-die reticle). The average transmittance of the calibrated reticle and that of the new reticle can be used to calculate the conversion factor. For example, suppose a scanner signature is derived from a test reticle with an average transmittance of about 20%, and that the average transmittance of a new reticle is 45%. The conversion factor can be calculated to be about 20%/45%=0.44.

With the scanner signature adapted to the new scanned reticle, the scanner map can now be interpolated/extrapolated to fit the new reticle. From Equation 1, the combined map describes the final wafer critical dimension uniformity (CDU) (Wafer$_{CDU}$=Mask$_{CDU}$+Scanner$_{CDU}$). Using the scanner signature generated from a specific design pitch, critical dimension uniformity improvement for that pitch may be improved while other pitches may have "lower" improvement, but may still be improved all together. A signature can be generated based on more features, giving a different weight for each critical pitch as needed. Scanners can be tracked for changes in signature (due to, for example, periodic maintenance and usage) and the dose mapper application can be updated with a new signature promptly with a new file generated per reticle for specific scanner. Table 1 below provides simulated results of executing the critical dimension correction process on several production masks.

TABLE 1

| Device description | Die size | 3 sigma from wafer before correction [nm] | Corrected 3 sigma with Galileo ® & scanner signature [nm] | CDU Improvement (simulation) |
|---|---|---|---|---|
| 2 × 3 layout (6 dies) | X Large | 1.134 | 0.585 | 48.4% |
| 3 × 4 layout (12 dies) | Large | 1.886 | 0.853 | 54.7% |
| 3 × 5 layout (15 dies) | Large | 0.827 | 0.653 | 21.0% (*) |
| 4 × 5 layout (20 dies) | Medium | 0.662 | 0.469 | 29.1% |
| 4 × 6 layout (24 dies) | Medium | 1.385 | 0.995 | 28.1% |
| 6 × 7 layout (42 dies) | Small | 1.371 | 0.951 | 30.6% |

(*) This reticle correction map was tested on a production wafer and yielded 17% real critical dimension uniformity improvement.

Table 1 shows that by applying the process described above of using the mask transmission measurement for reticle critical dimension uniformity prediction and scanner signature extraction to provide data to the dose mapper, a significant critical dimension uniformity improvement can be achieved. Die sizes and layout may contribute to the amount of critical dimension uniformity improvement. Table 1 shows a summary of the critical dimension uniformity improvement in terms of layout and die size. Larger die sizes appear to be more sensitive to mask critical dimension uniformity and scanner critical dimension uniformity, so the critical dimension uniformity improvement is greater for larger die size array.

Without being limited by any theory presented herein, Equation 3 can be derived based on an assumption that a vector of the scanner contribution is orthogonal to a vector of the mask contribution, as follows. The critical dimension at each measurement point on a wafer is influenced by the mask critical dimension uniformity and scanner field uniformity. Let us introduce functions Mcd(x,y) and Sf(x,y) to represent mask critical dimension uniformity and scanner field uniformity, respectively. Scanner field uniformity can be, for example, simple intensity distribution or any other scalar field property. Wcd (which represents wafer critical dimension uniformity) can be presented as a function that operates in the space of the mask and scanner parameters, in this example mask critical dimension Mcd and scanner field uniformity Sf:

$$Wcd=Wcd(Mcd,Sf).$$

Assuming that the variation of this function is small, we can write:

$$\delta Wcd=\partial Wcd/\partial Mcd*\delta Mcd+\partial Wcd/\partial Sf*\delta Sf.$$

Here, we ignore non-linear contributions of Mcd and Sf variations. Assume that Wcd is a homogeneous function and derivatives ∂Wcd/∂Mcd and ∂Wcd/∂Sf do not depend on x and y. We may introduce more convenient notations:

$$\delta(x,y)=M(x,y)+S(x,y),$$

where $$\delta(x,y)=\delta Wcd(x,y)$$

$$M(x,y)=\partial Wcd/\partial Mcd*\delta Mcd(x,y)=m*\delta Mcd(x,y)$$

$$S(x,y)=\partial Wcd/\partial sf*\delta sf(x,y)=s*\delta Sf(x,y)$$

Let us call M(x,y) mask contribution and S(x,y) scanner contribution. We note that the coefficient m in the mask critical dimension contribution component is a MEEF factor, and the coefficient s in the scanner critical dimension contribution is a "CD to Dose" ratio. Let us define measurement locations and substitute the function of x and y coordinates by discrete multidimensional vectors, where the i-th component of the vector represents the value of the function at the i-th location:

$$\delta_i=S_i+M_i.$$

We know from simple geometrical consideration that the transmittance variation of a pattern on the mask is proportional to the mask critical dimension variation. This is valid for small variations. Thus, we can state that, under the assumptions above, the mask contribution M is proportional to G, where $G_i$ is the transmittance die-to-average-die measurement at the i-th location:

$$\alpha G_i=M_i.$$

We assume that a vector of the scanner contribution is orthogonal to a vector of the mask contribution. This may not be entirely correct, but there is a geometrical justification for it. The mask contribution typically has a spherical fingerprint and the scanner contribution typically has a wedge plus parabolic profile across the slit and a constant profile along the slit. The scalar multiplication of these types of the vectors is about 10% of their norms:

$$(M*S)<<|M|*|S|.$$

These assumptions give us a simple way to distinguish the scanner and mask contributions:

$$(M*S)=0$$

$$(M*(\delta-M))=0$$

Recalling that M is proportional to G, we can state that the mask contribution is a projection of the vector of the wafer critical dimension variation δ on the direction of G:

$$M=G(\delta*G)/|G|^2$$

Hence we can present the coefficient α as:

$$\alpha=(\delta*G)/|G|^2,$$

which is Equation 3 above. The statistical error contribution of the mask and the scanner can be estimated as a norm of the vectors M and S:

$$E{scanner}=|S|=\sqrt{\sum_i S_i^2}$$

$$E{mask}=|M|=\sqrt{\sum_i M_i^2}=\alpha*|G|=\alpha\sqrt{\sum_i G_i^2}.$$

The Emask and Escanner values allow one to determine the relative contributions to the wafer critical dimension variation from the mask and the scanner.

Equation 3 can also be derived based on a least squares fit method. Again, without being bound by any theory presented herein, measurements of the transmission of a mask at positions i and o can be written as Ti and To, respectively. Using To as a reference, the transmission percentage change from To to Ti can be written as:

$$G_i = \frac{T_i - T_0}{T_0}.$$

The critical dimension variation $M_i$ is proportional to the transmission change from $T_0$ to $T_i$, so we can write:

$$M_i = \alpha G_i.$$

The factor a is called the "CD to dose" ratio and is determined by calibration using a mask or a wafer with known critical dimension values. The factor $\alpha$ is dependent on the type of the structure. For the determination of the factor $\alpha$, measurements $G_i$ and further measurements of the critical dimension variation $M_i$ on the wafer (e.g., by using critical dimension scanning electron microscopy (CD-SEM)) can be used. We use a least squares fit method to derive the factor $\alpha$:

$$a = \frac{\sum_i M_i G_i}{\sum_i G_i^2}$$

For a mask that has p dies, using the transmission measurement To at position o as reference, the measurements of the mask transmission percentage change at the position i within the die number n can be written as:

$$G_{in} = \frac{T_{in} - T_0}{T_0}.$$

To improve measurement accuracy, the deviation from the average of the measurements at all positions i within different dies p is calculated. It is in a more general way also possible to use the average of measurements at different positions i within one die that should have the same value.

$$G_{in}^{D2AD} = \frac{G_{in} - \overline{G_{in}}}{\overline{G_{in}}}$$

$$\overline{G_i} = \frac{1}{pT_0} \sum_n^p (T_{in} - T_0)$$

$$G_{in}^{D2AD} = \frac{T_{in} - T_0 - \frac{1}{p}\sum_n^p (T_{in} - T_0)}{\frac{1}{p}\sum_n^p (T_{in} - T_0)}$$

$$\Delta T_{in} := T_{in} - T_0$$

$$\overline{\Delta T_i} := \frac{1}{p}\sum_n^p \Delta T_{in}$$

$$G_{in}^{D2AD} = \frac{\Delta T_{in} - \overline{\Delta T_i}}{\overline{\Delta T_i}}$$

The following approximation (same critical dimension/transmission $\overline{T}$, $\overline{M}$ on the whole mask/wafer) can be applied:

$$M_{in} \approx \overline{M}$$

$$\overline{\Delta T_i} \approx \overline{\Delta T} \text{ when } \alpha \text{ is constant}$$

$$G_{in}^{(D2AD)} \approx \frac{\Delta T_{in} - \overline{\Delta T}}{\overline{\Delta T}}$$

$$\Delta M_{in} := M_{in} - \overline{M}$$

$$\Delta M_{in} := \alpha G_{in}^{(D2AD)}$$

For the determination of the factor $\alpha$, the transmission die-to-average-die measurements $G_{in}^{(D2AD)}$ and further measurements of the $\Delta M_{in}$ on the mask (e.g., using CD-SEM) or wafer can be used. We use a least squares fit method to determine the factor $\alpha$:

$$a = \frac{\sum_{in} \Delta M_{in} G_{in}^{(D2AD)}}{\sum_{in} G_{in}^2},$$

which is similar to Equation 3 above.

The features described above related to processing of data can be implemented in digital electronic circuitry, or in computer hardware, firmware, software, or in combinations of them. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or in addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

The described features related to processing of data can be implemented advantageously in one or more computer programs that are executable on a programmable system including at least one programmable processor coupled to receive data and instructions from, and to transmit data and instructions to, a data storage system, an input device, and an output device. A computer program is a set of instructions that can be used, directly or indirectly, in a computer to perform a certain activity or bring about a certain result. A computer program can be written in any form of programming language (e.g., Fortran, C, C++, Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

A number of implementations have been described. Nevertheless, it will be understood that various modifications may be made. For example, elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems.

In the discussion above, the scanner is interchangeable with a stepper. When a stepper is used, $\Delta CD_{wafer}$ can have a contribution from the photo mask and a contribution from the stepper (the contribution being referred to as $\Delta CD_{stepper}$), as shown in the following equation: $\Delta CD_{wafer} = \Delta CD_{mask} + \Delta CD_{stepper}$. The photo mask does not necessarily need to have patterns for several dies. For example, the photo mask can have a pattern for one die, in which the pattern has repeating features that have the same target properties (such as transmittance, reflectance, or critical dimension). For example, a large memory integrated circuit may have an array of memory cells, in which the memory circuit has repeating blocks of memory cells, and each block is almost identical to the other blocks. Each block can have several measurement points in which the transmittance at corresponding measurement points on different blocks have theoretical identical values. Accordingly, other implementations are within the scope of the following claims.

In the discussion above, the semiconductor wafer can be replaced by another type of substrate, such as a flat panel display substrate. For example, the features fabricated on a flat panel display substrate can be affected by both a photo mask and a scanner, so a substrate level critical dimension variation distribution (referred to as $\Delta CD_{substrate}$) can be affected by both the photo mask and the scanner. As an approximation, the $\Delta CD_{substrate}$ can be regarded as a sum of a contribution to the $\Delta CD_{substrate}$ from the photo mask (the contribution being referred to as $\Delta CD_{mask}$) and a contribution to the $\Delta CD_{substrate}$ from the scanner (the contribution being referred to as $\Delta CD_{scanner}$), as shown in the equation below:

$$\Delta CD_{substrate} = \Delta CD_{mask} + \Delta CD_{scanner}.$$

The invention claimed is:

1. A computer-implemented method comprising:
   determining, by a computer, a contribution to a wafer level critical dimension distribution from a photo mask; and
   determining, by the computer, a contribution to the wafer level critical dimension distribution from a scanner of a lithography system based on measured wafer level critical dimension uniformity distribution and the contribution to the wafer level critical dimension distribution from the photo mask;
   wherein the wafer level critical dimension refers to at least one dimension of at least one critical feature on a wafer, and
   wherein the scanner projects light through the photo mask to transfer a pattern on the photo mask to the wafer.

2. The method of claim 1, in which determining the contribution to the wafer level critical dimension distribution from the photo mask comprises measuring light transmission across the photo mask.

3. The method of claim 2 in which determining the contribution to the wafer level critical dimension distribution from the photo mask comprises determining a transmittance variation distribution of the photo mask, and determining the contribution to the wafer level critical dimension distribution from the photo mask based on the transmittance variation distribution of the photo mask.

4. The method of claim 3 in which determining the contribution to the wafer level critical dimension distribution from the photo mask based on the transmittance variation distribution of the photo mask comprises applying a correction factor to the transmittance variation distribution of the photo mask, the correction factor being based on a linear ratio between wafer level critical dimension variations and transmission variations.

5. The method of claim 3 in which determining the transmittance variation distribution of the photo mask comprises
   measuring the transmittance at one location in each of a plurality of regions of the photo mask, each region having a pattern corresponding to a die,
   calculating an average of the measurement values for corresponding locations of the plurality of regions,
   for each measurement value, calculating a ratio between the measurement value and the average, and
   determining the transmittance variation distribution of the photo mask based on the ratios.

6. The method of claim 5, comprising
   measuring the transmittance at a plurality of locations in each of the plurality of regions, each location in any region having a corresponding location in each of the other regions,
   for each group of corresponding locations in the plurality of regions,
      calculating an average of the transmittance for the group of corresponding locations,
      for each location in the group, calculating a ratio between the transmittance of the location and the average transmittance for the group, and
   determining the transmittance variation distribution of the photo mask based on the ratios.

7. The method of claim 2 in which measuring the light transmission comprises performing transmission measurements at a plurality of locations on the photo mask using a non-imaging tool to generate transmission information.

8. The method of claim 1 in which the wafer level critical dimension distribution comprises a matrix of wafer level critical dimension values.

9. The method of claim 1, comprising determining a contribution to a second wafer level critical dimension distribution from a second photo mask.

10. The method of claim 8 in which determining a contribution to a second wafer level critical dimension distribution comprises determining a contribution to a second wafer level critical dimension distribution from a second photo mask by measuring light transmission across the second photo mask.

11. The method of claim 8, comprising determining the second wafer level critical dimension distribution based on the contributions to the second wafer level critical dimension distribution from the second photo mask and the scanner.

12. The method of claim 11 in which the second wafer level critical dimension distribution is determined without measuring a critical dimension on a wafer after the contribution to the wafer level critical dimension distribution from the scanner is determined.

13. The method of claim 11, comprising adjusting a parameter of the scanner based on the second wafer level critical dimension distribution when using the second photo mask to improve wafer level critical dimension uniformity.

14. The method of claim 13 in which adjusting a parameter of the scanner comprises adjusting a dosage of illumination provided by the scanner.

15. The method of claim 1 in which the wafer level critical dimension distribution provides information about a distribution of a size of a feature on the wafer, in which multiple instances of the feature are repeated across the wafer.

16. The method of claim 1 in which determining the contribution to the wafer level critical dimension distribution from the scanner comprises subtracting the contribution to the wafer level critical dimension distribution from the photo mask from the measured wafer level critical dimension uniformity distribution.

17. A computer-implemented method comprising:
determining, by a computer, a contribution to a critical dimension uniformity distribution of a substrate from a photo mask; and
determining, by the computer, a contribution to the critical dimension distribution of the substrate from a scanner of a lithography system based on measured critical dimension uniformity distribution of the substrate and the contribution to the critical dimension distribution of the substrate from the photo mask;
wherein the critical dimension refers to at least one dimension of at least one critical feature of the substrate, and
wherein the scanner projects light through the photo mask to transfer a pattern on the photo mask to the substrate.

18. A system comprising:
a photo mask transmission measurement sub-system to measure light transmission across a photo mask, the photo mask transmission measurement sub-system comprising a light source, optics to project light from the light source to the photo mask, and a detector to detect light transmitted through the photo mask; and
a computing system configured to:
determine a contribution to a critical dimension distribution of a substrate from the photo mask based on the measured light transmission across the photo mask, and
determine a contribution to the critical dimension distribution of the substrate from a scanner based on measured critical dimension uniformity distribution of the substrate and the contribution to the critical dimension distribution of the substrate from the photo mask;
wherein the critical dimension refers to at least one dimension of at least one critical feature of the substrate, and
wherein the scanner projects light through the photo mask to transfer a pattern on the photo mask to the substrate.

19. The system of claim 18 in which the substrate comprises at least one of a semiconductor wafer or a flat panel display substrate.

20. The system of claim 18 in which the computing system is configured to
calculate, for each of a plurality of transmittance values measured from a plurality of locations on the photo mask, a ratio between the transmittance value and an average of the plurality of transmittance values, and
determine the contribution to the critical dimension distribution of the substrate from the photo mask based on the ratios.

21. A method comprising:
determining a contribution to a wafer level critical dimension distribution from a scanner of a lithography system based on measured wafer level critical dimension uniformity distribution and a contribution to the wafer level critical dimension distribution from a photo mask;
determining the contribution to the wafer level critical dimension distribution from the photo mask by measuring light transmission across the photo mask, in which determining the contribution to the wafer level critical dimension distribution from the photo mask comprises determining a transmittance variation distribution of the photo mask, and determining the contribution to the wafer level critical dimension distribution from the photo mask based on the transmittance variation distribution of the photo mask;
wherein determining the transmittance variation distribution of the photo mask comprises
measuring the transmittance at one location in each of a plurality of regions of the photo mask, each region having a pattern corresponding to a die,
calculating an average of the measurement values for corresponding locations of the plurality of regions,
for each measurement value, calculating a ratio between the measurement value and the average, and
determining the transmittance variation distribution of the photo mask based on the ratios; and
measuring the transmittance at a plurality of locations in each of the plurality of regions, each location in any region having a corresponding location in each of the other regions;
for each group of corresponding locations in the plurality of regions,
calculating an average of the transmittance for the group of corresponding locations,
for each location in the group, calculating a ratio between the transmittance of the location and the average transmittance for the group, and
determining the transmittance variation distribution of the photo mask based on the ratios.

22. A method comprising:
determining a contribution to a wafer level critical dimension distribution from a scanner of a lithography system based on measured wafer level critical dimension uniformity distribution and a contribution to the wafer level critical dimension distribution from a photo mask;
determining a contribution to a second wafer level critical dimension distribution from a second photo mask; and
determining the second wafer level critical dimension distribution based on the contributions to the second wafer level critical dimension distribution from the second photo mask and the scanner.

23. The method of claim 22 in which the second wafer level critical dimension distribution is determined without measuring a critical dimension on a wafer after the contribution to the wafer level critical dimension distribution from the scanner is determined.

24. The method of claim 22, comprising adjusting a parameter of the scanner based on the second wafer level critical dimension distribution when using the second photo mask to improve wafer level critical dimension uniformity.

25. The method of claim 24 in which adjusting a parameter of the scanner comprises adjusting a dosage of illumination provided by the scanner.

* * * * *

UNITED STATES PATENT AND TRADEMARK OFFICE
CERTIFICATE OF CORRECTION

PATENT NO. : 9,134,112 B2
APPLICATION NO. : 13/579366
DATED : September 15, 2015
INVENTOR(S) : Ofir Sharoni et al.

It is certified that error appears in the above-identified patent and that said Letters Patent is hereby corrected as shown below:

In the Specification

Column 17

Line 60 (approx.), delete "$\Delta CD_{substrate} = \Delta CD_{mask} \approx \Delta CD_{scanner}$" and insert -- $\Delta CD_{substrate} = \Delta CD_{mask} + \Delta CD_{scanner}$ --

Signed and Sealed this
Fifth Day of July, 2016

Michelle K. Lee
*Director of the United States Patent and Trademark Office*